(12) United States Patent
Yoshikawa et al.

(10) Patent No.: US 6,918,050 B2
(45) Date of Patent: Jul. 12, 2005

(54) DELAY ADJUSTMENT CIRCUIT AND A CLOCK GENERATING CIRCUIT USING THE SAME

(75) Inventors: Atsushi Yoshikawa, Osaka (JP); Yasuhiko Hagihara, Tokyo (JP)

(73) Assignee: NEC Corporation, Tokyo (JP)

( * ) Notice: Subject to any disclaimer, the term of this patent is extended or adjusted under 35 U.S.C. 154(b) by 597 days.

(21) Appl. No.: 09/773,595

(22) Filed: Feb. 2, 2001

(65) Prior Publication Data

US 2001/0013101 A1 Aug. 9, 2001

(30) Foreign Application Priority Data

Feb. 4, 2000 (JP) .................................... 2000-028077

(51) Int. Cl.[7] .............................................. G06F 1/04
(52) U.S. Cl. .................... 713/503; 713/401; 327/276
(58) Field of Search ................................ 713/400, 401, 713/500, 501, 503; 327/149, 153, 158, 161, 166, 175, 176, 276, 277

(56) References Cited

U.S. PATENT DOCUMENTS

| | | | | |
|---|---|---|---|---|
| 5,552,726 A | * | 9/1996 | Wichman et al. | 327/149 |
| 5,935,257 A | * | 8/1999 | Nishimura | 713/503 |
| 5,963,074 A | * | 10/1999 | Arkin | 327/276 |
| 6,377,092 B2 | * | 4/2002 | Ikeda | 327/158 |
| 6,421,784 B1 | * | 7/2002 | Chu et al. | 713/401 |

FOREIGN PATENT DOCUMENTS

| | | |
|---|---|---|
| JP | 62-254515 | 11/1987 |
| JP | 63-237610 | 10/1988 |
| JP | 63-258112 | 10/1988 |
| JP | 63-293941 | 11/1988 |
| JP | 1-220914 | 9/1989 |
| JP | 03-250914 | 11/1991 |
| JP | 05-037349 | 2/1993 |
| JP | 06-282350 | 10/1994 |
| JP | 10-335470 | 12/1998 |

OTHER PUBLICATIONS

Goto et al. "CMOS Programmable Delay Vernier"—Oct. 1994—Hewlett–Packard Journal—vol. 45, Issue 5, p. 51–58.*

* cited by examiner

*Primary Examiner*—Thuan Du
(74) *Attorney, Agent, or Firm*—Foley & Lardner LLP

(57) ABSTRACT

The present invention provides for adjusting the delay time interval of an input signal by controlling the internal register value and internal signal in a semiconductor integrated circuit device, or an external signal. The invention comprises a first gate array 10 for carrying out fine adjustment of the delay time interval of the input signal, capacitances 60 to 63 and 70 to 73 connected to the output side of a specified gate in the first gate array via first switching device 40 to 43, a second gate array 20 for carrying out rough adjustment of the delay time interval of the input signal; and a control device 30 that adjusts the delay time interval of the input signal by adjusting the capacitances connected to the output side of a specified gate in the first gate array and the number of gate stages in the second gate array 20.

6 Claims, 9 Drawing Sheets

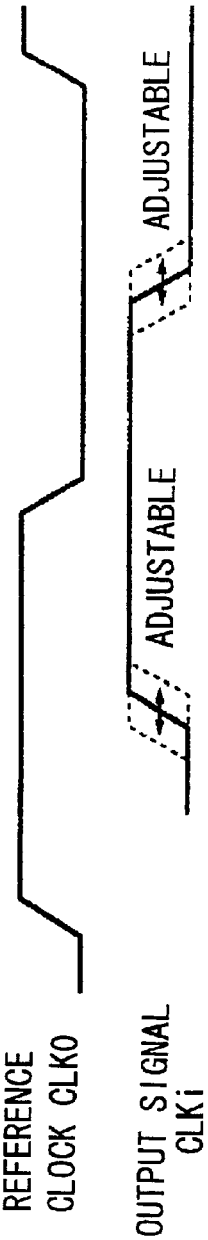
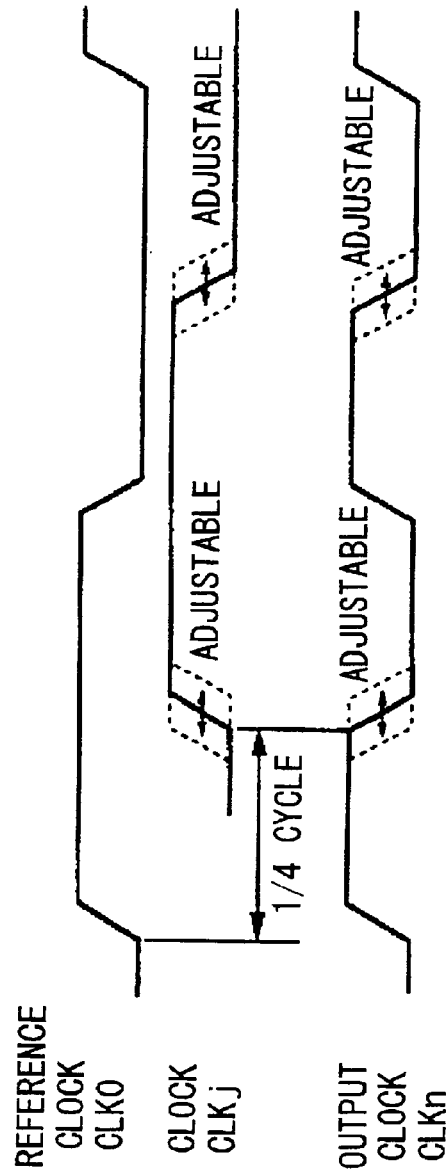
FIG. 3A  REFERENCE CLOCK CLK0
FIG. 3B  OUTPUT SIGNAL CLKi
FIG. 5A  REFERENCE CLOCK CLK0
FIG. 5B  CLOCK CLKj
FIG. 5C  OUTPUT CLOCK CLKn

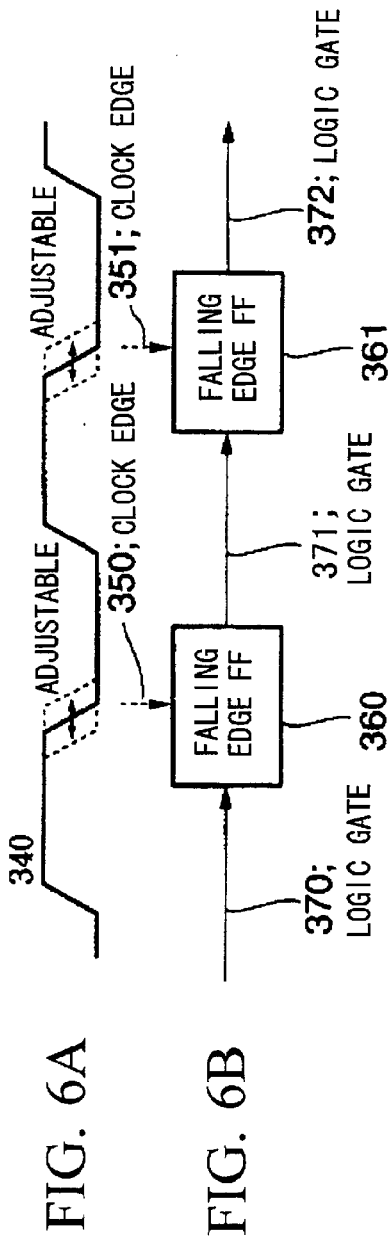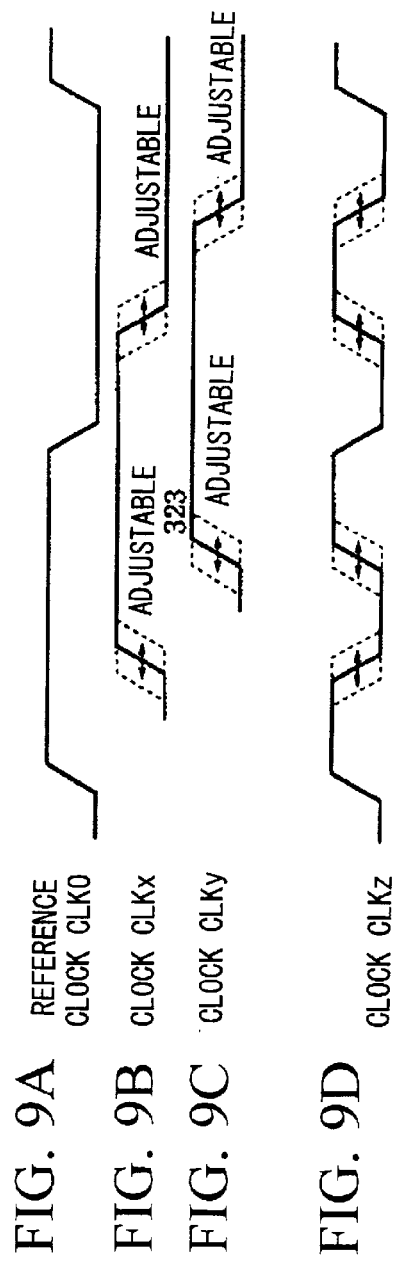
FIG. 6A
FIG. 6B
FIG. 9A  REFERENCE CLOCK CLK0
FIG. 9B  CLOCK CLKx
FIG. 9C  CLOCK CLKy
FIG. 9D  CLOCK CLKz

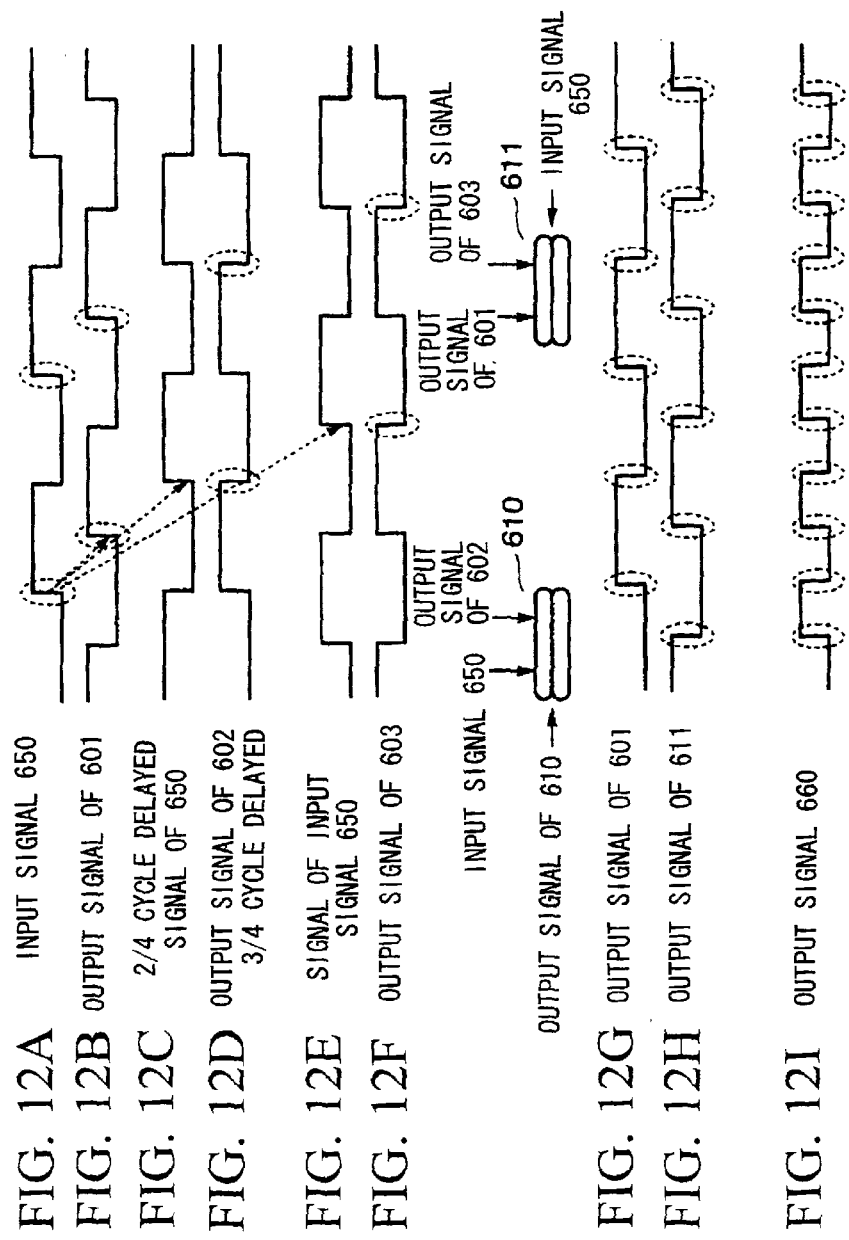

DELAY ADJUSTMENT CIRCUIT AND A CLOCK GENERATING CIRCUIT USING THE SAME

BACKGROUND OF THE INVENTION

1. Field of the Invention

The present invention relates to a delay adjustment circuit having an adjustable waveform that is used to generate a clock signal employed during digital processing and a clock generating circuit that generates a clock having a predetermined frequency using this delay adjustment circuit.

2. Description of the Related Art

In a conventional clock generating circuit, in order to generate a clock that is 0.5×N (N=3, 4, 5, . . . ) times the operating frequency of a reference clock, a PLL circuit is frequently used. As shown in FIG. 14, a generally used PLL circuit 800 is formed by a phase comparing circuit 802, a low pass filter (LPF) 804, a voltage control oscillator (VCO) 806, and a 1/N divider 808. Reference numeral 810 is a clock distributing circuit that supplies to each part the clock generated by the PPL circuit 800.

This PLL 800 generates a clock 807 having an operating frequency that is N-times the reference clock that is input into the PLL circuit 800. From the clock 807 generated by the PPL circuit 800, the output clock 809 is supplied to each block within the semiconductor integrated circuit device (LSI) via the clock distributing circuit 810. The comparison signal 810, which is the output clock 809 divided by 1/N by the 1/N divider 808, is fed back, and the phase difference between it and the reference clock 801 is detected by the phase comparing circuit 802.

The phase difference detection pulse 803, which is the output of the phase comparing circuit 802, has a pulse width that depends on the phase difference, and is integrated by the low pass filter 804, and the control voltage 805 of the VCO having a value that depends on this pulse width is input into the voltage control oscillator (VCO) 806. In addition, depending on the phase difference between the reference clock 801 and the comparison signal 810, the oscillating frequency of the voltage control oscillator circuit 806 changes, and finally, the output 809 of the clock distributing circuit 810 is controlled so as to be in synchronism with the reference clock 801.

In this manner, the PPL circuit can be used to compensate the variation in the semiconductor integrated circuit in the capacity, wiring thickness, wiring width, etc., of the transistors that are produced during manufacture of the semiconductor integrated circuit. However, the PPL circuit exhibits the phenomenon that the width of the output waveform increases and decreases through time when the power source voltage increases and decreases accompanying the fluctuation in the operation rate of the adjacent circuits. This is called jitter. Even while the PPL circuit is operating in synchronism with the reference clock 801, the jitter does not necessarily disappear after using the PLL circuit.

In addition, in the case that the waveform of the reference clock 801 differs from the expected waveform due to fluctuation in the duty ratio, there are cases when the phase comparing circuit does not function as expected.

There is the problem that if the jitter is large and the duty function differs from estimates assumed during the design, the manufactured LSI may not operate, and then must be remanufactured or redesigned.

SUMMARY OF THE INVENTION

In consideration of the above-described situation, a first object of the present invention is to provide a delay adjustment circuit that can adjust the delay time interval of an input signal by controlling internal register values and the internal signals of the semiconductor integrated circuit, or external signals. In addition, a second object of the present invention is to provide a clock generating circuit that can compensate the clock skew caused by manufacturing variations in the semiconductor integrated circuit device and the duty ratio, and in addition minimize jitter by using the delay adjustment circuit having a delay time interval that can be regulated by controlling the internal register values and the internal signals of the semiconductor integrated transistor device and external signals.

In order to attain the above-described objects, a first aspect of the present invention is characterized in providing a first gate array for carrying out fine adjustment of the delay time interval wherein each gate is serially connected, capacitance connected to the output side of a specified gate in the first gate array via a first switching device, a second gate array for carrying out rough adjustment of the delay time interval of the input signal that is connected to the output side of the first gate array via a second switching device, and a control device that controls the first and second switching device so as to adjust the delay time interval of the input signal by adjusting the capacitance connected to the output side of the specified gate in the first gate array and the number of gate stages in the second gate array.

In addition, in the delay adjustment circuit described in the first aspect, a second aspect of the present invention is characterized in the control device being provided on board the semiconductor integrated circuit device, being formed to include a register that can set an output value that depends on an internal signal, and adjusting the gate output load and the number of gate stages in the second gate array by switch controlling the first and second switching device based on the register value set in the register.

In addition, in the delay adjustment circuit described in the first aspect, a third aspect of the present invention is characterized in the control device being provided on board the semiconductor integrated circuit device, being formed to include a register that can set the output value externally by initialization, and adjusting the gate output load and the number of gate stages in the second gate array by switch controlling the first and second switching device based on the register value set in the register.

According to the delay adjustment circuit described in the first, second, and third aspects, there are a first gate array for carrying out fine adjustment of the delay time interval that has each gate serially connected, capacitance connected to the output side of a specified gate in the first gate array via a first switching device, a second gate array for carrying out rough adjustment of the delay time interval of the input signal that is connected to the output side of the first gate array via a second switching device, and a control device that controls the first and second switching device so as to adjust the delay time interval of the input signal by adjusting the capacitance connected to the output side of the specified gate in the first gate array and the number of gate stages in the second gate array, and thereby the delay time interval of the input signal can be adjusted by controlling the internal register values, an internal signals of the semiconductor integrated circuit device, or an external signal.

In addition, a fourth aspect of the present invention is a clock generating circuit characterized in providing the delay adjustment circuit described in the first through third aspects into which the reference clock is input and a logic circuit that carries out logical processing of the output signal of the delay adjustment circuit described in any of the first through third aspects and outputs a clock having an operational frequency N times that of this reference clock.

According to the clock generating circuit described in the fourth aspect, a delay adjustment circuit that can adjust the waveform without using a PLL circuit is used, and thereby the clock skew caused by production variation in the semiconductor integrated circuit device and the duty ratio can be compensated, and the jitter can be minimized.

In addition, a fifth aspect of the present invention is characterized in providing the clock generating circuit described in the fourth aspect and a flip flop that is provided between logic gates and operated at the timing of a specified adjustable edge in the clock generating circuit.

According to the semiconductor integrated circuit device described in the fifth aspect, a flip flop that operates at the timing of a specified adjustable edge in the clock generating circuit is provided between logic gates, and thereby the influence of clock skew and jitter can be suppressed to a minimum.

In addition, a sixth aspect of the present invention is characterized in providing the delay adjustment circuit described in any of the first through third aspects into which the reference clock is input, a logic circuit that carries out logical processing of a reference clock and the output signal of the delay adjustment circuit described in any of the first through third aspects and outputs a clock having an operational frequency N times that of this reference clock, and a setting device that fixes the output of the delay adjustment circuit described in any of claim 1 to claim 3 to a constant value only during the non-operational mode, and wherein a clock is output that has an operational frequency that is equal to that of the reference clock when serving as the non-operational mode or N times the reference clock when serving as the operational mode based on the result of the logical processing of the logic circuit.

According to the clock generating circuit described in the sixth aspect, the delay adjustment circuit described in any of the first through third aspects is provided into which the reference clock is input, logic circuit that carries out logical processing of a reference clock and the output signal of the delay adjustment circuit described in any of the first through third aspects and outputs a clock having an operational frequency N times this reference clock, and a setting device that fixes the output of the delay adjustment circuit described in any of the first through third aspects to a constant value only during the non-operational mode, and wherein a clock is output that has an operational frequency that is equal to that of the reference clock when serving as the non-operational mode or N times the reference clock when serving as the operational mode based on the result of the logical processing of the logic circuit, and thereby a clock can be output that has a controllable waveform having an operational frequency equal to the reference clock when serving as a non-operational mode or N times the reference clock when serving as the reference clock.

In addition, the invention according to a seventh aspect is characterized in providing the delay adjustment circuit described in either of the second or third aspects, a duty ratio detecting device that detects the duty ratio of the clock output of this clock generating circuit, and a control device that automatically updates the register value in this delay adjustment circuit so as to become a pre-set duty ratio based on the detected output of the duty ratio detecting device.

According to the clock generating circuit described in the seventh aspect, the delay adjustment circuit described in either of the second or third aspects provides a duty ratio detecting device that detects the duty ratio of the clock output of this clock generating circuit, and a control device that automatically updates the register value in this delay adjustment circuit so as to become a pre-set duty ratio based on the detected output of the duty ratio detecting device, and thereby the duty ratio of the clock can be automatically adjusted so as to become the expected value.

In addition, an eighth aspect of the present invention is characterized in providing the delay adjustment circuit described in either of the second or third aspects, a clock skew detecting device that detects clock skew, and a control device that automatically updates the register values in the delay adjustment circuit so that the clock skew becomes a pre-set expected value based on the detected output of the clock skew detecting device.

According to the clock generating circuit described in the eighth aspect, the delay adjustment circuit described in either of the second or third aspects provides a clock skew detecting device that detects clock skew and a control device that automatically updates the register values in the delay adjustment circuit so that the clock skew becomes a pre-set expected value based on the detected output of the clock skew detecting device, and thereby the clock skew can be automatically adjusted so as to become a pre-set expected value.

In addition, a ninth aspect of the present invention is characterized in providing one or more delay adjustment circuits having a delay time interval that can be adjusted by the internal register values, the values of the internal memory, and an internal logic signal in the semiconductor integrated circuit device, or an external logic signal, and a logic circuit that outputs a clock having a desired frequency by carrying out logic processing between one or more signals, these signals being the input signals that have been delayed a specified time interval by one or more of the delay circuits.

According to the clock generating circuit described in the ninth aspect, a PPL circuit is not used, the clock waveform can be controlled, and thereby the jitter produced during operation of the semiconductor integrated circuit device (LSI) can be reduced, and the clock waveform can be adjusted with respect to the clock skew and fluctuations in the duty cycle of the clock caused by production variations in the transistor function, wiring width, and wiring thickness in the LSI.

In addition, a tenth aspect of the present invention is characterized in providing first, second, and third delay adjusting circuits having a delay time interval that can be adjusted according to the value of an internal register, the value of the internal memory, and the internal logic signal of the semiconductor integrated circuit device, or an external logic signal, a first selector to which the input terminals of the three delay adjustment circuits are connected in common and that selects the input of the three delay adjustment circuits or the output of the second delay adjustment circuit depending on one of both of the outputs of the first and third delay adjustment circuits, a second selector that selects the output of the first or third delay adjustment circuits depending on one or both of the input signal of the three delay adjustment circuits or the output of the second delay adjustment circuit, and a logic circuit that finds the exclusive AND of the output signals of the first and second selectors.

In addition, an eleventh aspect of the present invention is characterized in providing a first, second, third, and fourth delay adjusting circuits having a delay time interval that can be adjusted according to the value of an internal register, the value of the internal memory, and the internal logic signal of the semiconductor integrated circuit device, or the external signal, a first selector to which the input terminals of the four delay adjustment circuits are connected in common and that selects the output of the first and third delay adjustment circuits depending on one of both of the outputs of the second and fourth delay adjustment circuits, a second selector that selects the output of the second or fourth delay adjustment circuits depending on one or both of the output signal of the first and third delay adjustment circuits, and a logic circuit that finds the exclusive AND of the output signals of the first and second selectors.

According to the clock generating circuit described in the tenth and eleventh aspects, the reference clock serves as the input, the output of a plurality of delay adjustment circuits having a delay time interval that can be adjusted according to the internal register value, the value of the internal memory, and the internal logic signal of the semiconductor integrated circuit device, or an external signal are combined by a plurality of selectors, and the exclusive AND of the output of these selectors is taken by the logic circuit, and thereby a clock having a free duty ratio can be generated irrespective of the duty ratio of the reference clock that is the input signal.

BRIEF DESCRIPTION OF THE FIGURES

FIGS. 3A and 3B are timing charts that show the reference clock, which is the input signal, and the output timing of clock, which is the output signal, of the delay adjustment circuit in FIG. 2.

FIGS. 5A to 5C are timing charts that show signals of each part of the clock generating circuit shown in FIG. 4.

FIGS. 6A and 6B are explanatory drawings showing the waveforms of the clock having a specified adjustable edge generated by the clock generating circuit and the circuit structure of the semiconductor integrated circuit device that provides flip flops that operate at the timing of a specified edge of this clock between the logic gates.

FIGS. 9A to 9D are timing charts showing the signals of each part of the clock generating circuit shown in FIG. 8.

FIGS. 12A to 12I are timing charts showing the operating waveforms of each part of the clock generating circuit shown in FIG. 11.

PREFERRED EMBODIMENTS OF THE PRESENT INVENTION

Figure 1:
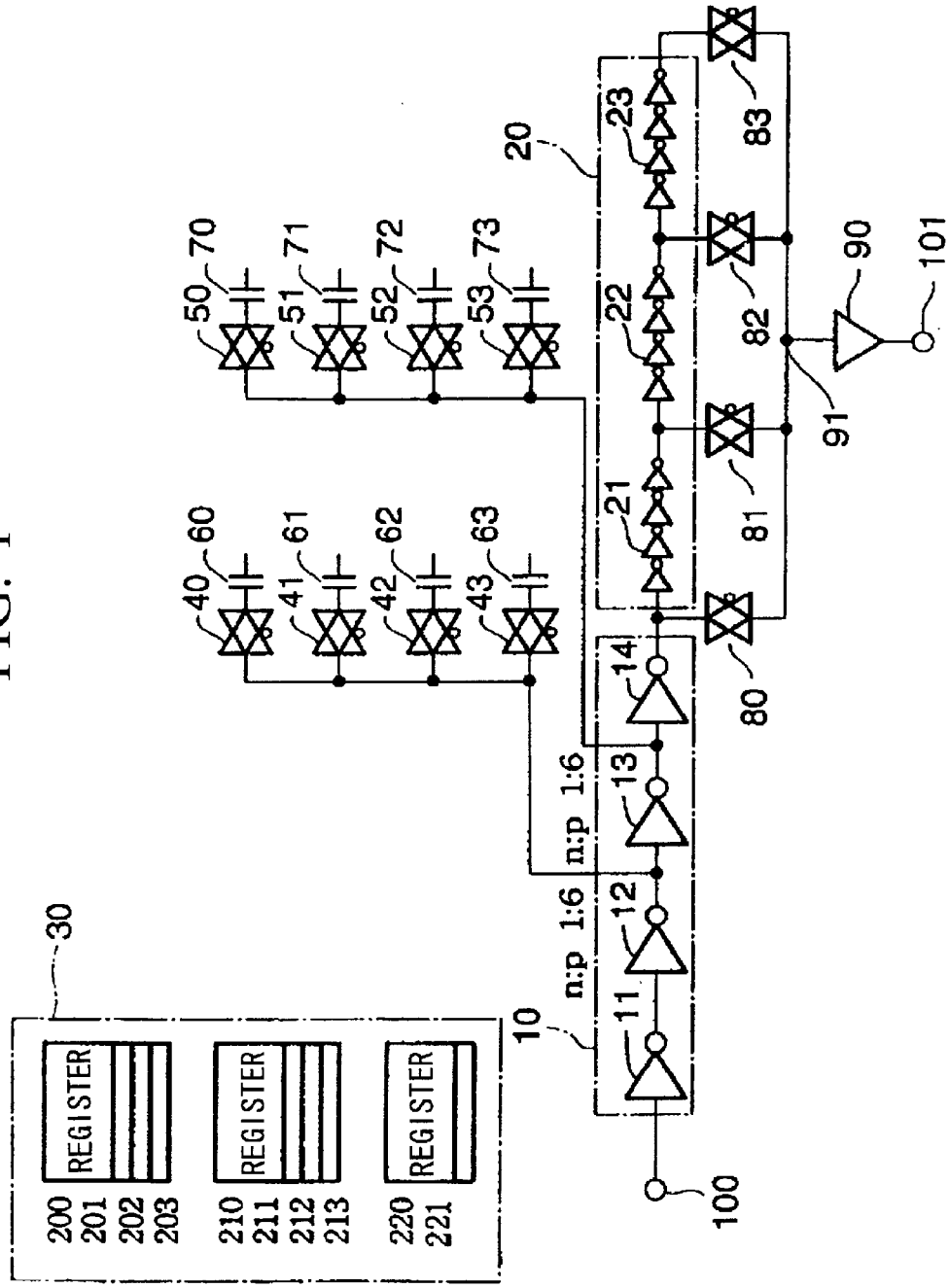
FIG. 1 is a circuit diagram that shows the concrete structure of the delay adjustment circuit according to the embodiments of the present invention.

Below, the embodiments of the present invention are described in detail referring to the figures. The structure of the delay adjustment circuit according to the embodiments of the present invention is shown in FIG. 1. In this figure, the delay adjustment circuit according to the embodiment of the present invention comprises inverters 11 to 14, each of whose gates are serially connected and form the first gate array 10 for carrying out fine adjustment of the delay time interval of the input signal, capacitances 60 to 63 and 70 to 73 that are connected to the output side of the inverters 12 and 13 from in the first gate array via the transfer gates 40 to 43 and 50 to 53 that serve as the first switching device, inverter chains 21 to 23 that are connected to the output side of the first gate array 10 via the transfer gates 80 to 83 that serve as the second switching device for carrying out rough adjustment of the delay time interval of the input signal, and the register array 30 serving as a control device that controls the transfer gates 40 to 42, 50 to 53, and 80 to 83 that serve as the first and second switching device so that the delay time interval of the input signal is adjusted by adjusting the capacitances 60 to 63 connected to the output side of the inverters 12 and 13 in the first gate array 10 and the number of gate stages in the second gate array 20.

The input side of the inverter 11 forming the first gate array 10 is connected to the input terminal 100, and the output side of the inverter 11 is connected in sequence to the inverters 12, 13, and 14, and the output side of inverter 14 is further connected in sequence to the inverter chains 21 to 23. The inverter chains 21 to 23 are gate delay circuits formed by an odd number of stages of inverters.

The output side of the inverter 12 in the first gate array 10 is connected to the input side of the transfer gates 40 to 43, and the output side of the inverter 13 is connected to the input side of the transfer gates 50 to 53. The respective capacitances 60 to 63 are connected to the output side of the transfer gates 40 to 43, and the respective capacitances 70 to 73 are connected to the output side of the transfer gates 50 to 53. The output side of the inverter 14 and the inverter chains 21 to 23 are respectively connected to the input sides of the transfer gates 80 to 83.

In addition, the output sides of the transfer gates 80 to 83 are connected in common, and form a 4-input selector that is controlled so that only one transfer gate among the transfer gates 80 to 83 is selectively turned ON. The output side of the transfer gates 80 to 83 that form this 4-input selector are connected to the output terminal 101 of the delay adjustment circuit via the buffer 90.

The signal output from the registers 200 to 203 are supplied respectively to transfer gates 40 to 43 as control input signals, and the signals output from the registers 210 to 213 are respectively supplied to the transfer gates 50 to 53 as control input signals. By adjusting the control input signals supplied to the transfer gates 40 to 43 using the register values that are set in the registers 200 to 203, the capacitance that serves as the output load of the inverter 12 can be set as the combined capacitance by combining capacitances 60 to 63. In addition, by adjusting the control input signal supplied to the transfer gates 50 to 53 using the register values that are set in the registers 210 to 213, and the capacitance value that serve as the output load of the inverter 13 can be set as the combined capacitance by combining the capacitances 70 to 73.

When the capacitance values of the capacitances 61 to 63 are two times, four times, or eight times the capacitance value of the capacitance 60, the capacitance value of the combined capacitance can be adjusted by multiple units from zero to 15 times the capacitance value of the capacitance 60 to serve as the output load of the inverter 12. In the same manner, when the capacitance values of the capacitances 71 to 73 are two times, four times, or eight times the capacitance value of the capacitance 70, the capacitance value of the combined capacitance can be adjusted by multiple units from zero to 15 times the capacitance value of the capacitance 70 to serve as the output load of the inverter 13.

The inverters 12 and 13 are designed so as to enlarge the gate width of the PMOS transistor, and become smaller than the ON resistance of the NMOS transistor. When designed in this manner, the output load more easily influences the falling of the signal, which requires the electromotive force of the NMOS transistor, than the rising of the signal, which requires the motive force of the PMSO transistor. Therefore, the falling of the signal output by the output terminal 101 can be made to fluctuate by adjusting the output load of the inverter 12, and in addition, the rising of the signal output by the output terminal 101 can be caused to fluctuate by adjusting the output load of the inverter 13. Thereby, the rising waveform and the falling waveform of the signal output from the output terminal 101 can each be adjusted by suitable output load adjustments of the inverters 12 and 13.

The signals output from the registers 220 and 221 are converter by a decoder (not illustrated), and supplied to the transfer gates 80 to 83 as control input signals. Only one among the transfer gates 80 to 83 is turned ON by the control input signal supplied to the transfer gates 80 to 83, and, the number of gate stages between the input terminal 100 and the output terminal 101 of the delay adjustment circuit can be adjusted by the set data in registers 220 and 221. Each of the registers 200 to 203, 210 to 213, and 220 and 221 are provided on board the semiconductor integrated circuit device (LSI), and the register values can be set by an internal signal or externally by initialization.

In the delay adjustment circuit structured as described above, by carrying out the fine adjustment of the delay time interval of the input signal by the output load adjustment of the inverters 12 and 13, that is, by gate output load adjustment, and carrying out rough adjustment of the delay time interval of the input signal by adjusting the number of input and output gate stages by switching the invertors 21 to 23, each of the delay time intervals of the rise and fall of the signal input from the input terminal 100 can be adjusted before being output from the output terminal 101.

Moreover, in the present embodiment, registers are used as the control device and the delay time interval can controlled by their set values, but this is not limiting, and control of the delay time interval can be carried out by the value of an internal memory, an internal logic signal, or an external signal.

Figure 2:
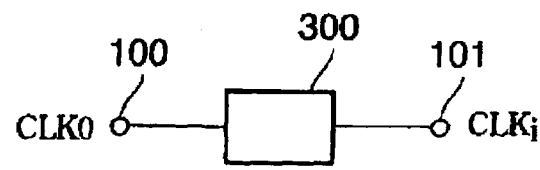
FIG. 2 is a block diagram that shows the input and output relationships of the delay adjustment circuit shown in FIG. 1.

As shown in FIG. 2, when a reference clock CLK0 is input as an input signal into the input terminal 100 of the delay adjustment circuit 300, the reference clock CLK0 and the operational waveform are equal, and a clock CLKi having a waveform whose rise and fall can be adjusted can be generated. FIG. 3 shows the waveform diagram of the reference clock CLK0 and the clock CLKi having an adjustable waveform.

Figure 4:
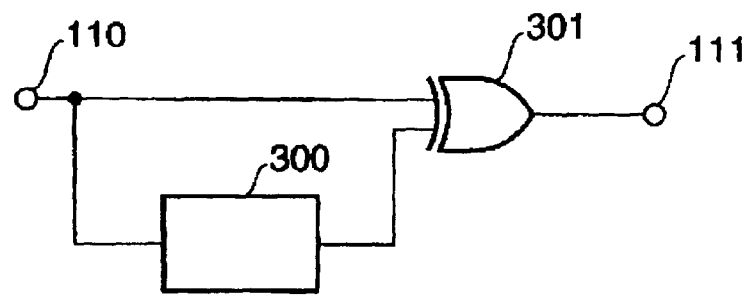
FIG. 4 is a circuit diagram that shows the structure of the clock generating circuit according to the first embodiment of the present invention.

Next, the structure of the clock generating circuit according to a first embodiment of the present invention is shown in FIG. 4.

The clock generating circuit according to the present embodiment comprises a delay adjustment circuit 300 having the structure described in FIG. 1, whose input signal is the reference clock CLK0, and the exclusive OR circuit 301 that carries out an exclusive OR operation on the reference clock CLK0 and the output signal of the delay adjustment circuit 300.

In the above-described structure, when a clock CLLj delayed by ¼ of a cycle by the delay adjustment circuit 300 with respect to a reference clock CLK input into the input terminal 110 is generated and the exclusive OR of the reference clock CLK0 and the clock CLLj is taken by the exclusive OR circuit 301, a clock CLKn having an operating frequency twice that of the reference clock CLK0 can be generated. Because the waveform of the clock CLLj can be adjusted by controlling the register values, the falling edge of CLKn is adjustable. The reference clock and the output timing of the clock CLLj and clock CLKn are shown in FIG. 5.

According to the clock generating circuit of the first embodiment of the present invention, the clock skew the duty ratio caused by production variation in the semiconductor integrated circuit device and can be compensated, and the jitter can be minimized.

Next, the case of designing the semiconductor integrated circuit assuming that the fall of the waveform is to be used as the adjustable clock timing signal will be explained. FIG. 6(A) shows the waveform of the clock CLKn that is output by the clock generating circuit shown in FIG. 4. FIG. 6(B) shows the structure of the above-described semiconductor integrated circuit device. This semiconductor integrated circuit device provides the clock generating circuit shown in FIG. 4, logic gates 370, 371, and 371, and falling edge flip flops 360 and 361 that are provided between the logic gates 370, 371, and 372, and operate at the timing of a specified adjustable edge (in this case, the falling edge) in the clock generating circuit.

In the above-described structure, in the falling edge flip flops 360 and 361, respective clock edges 350 and 351 are input. The logic gates 370, 371, and 372 represent the logic gates that are between the respective flip flops. When LSI design is carried out that uses only the adjustable falling edge of this clock CLKn, the influence of clock skew and jitter can be reduced to a minimum.

Figure 7:
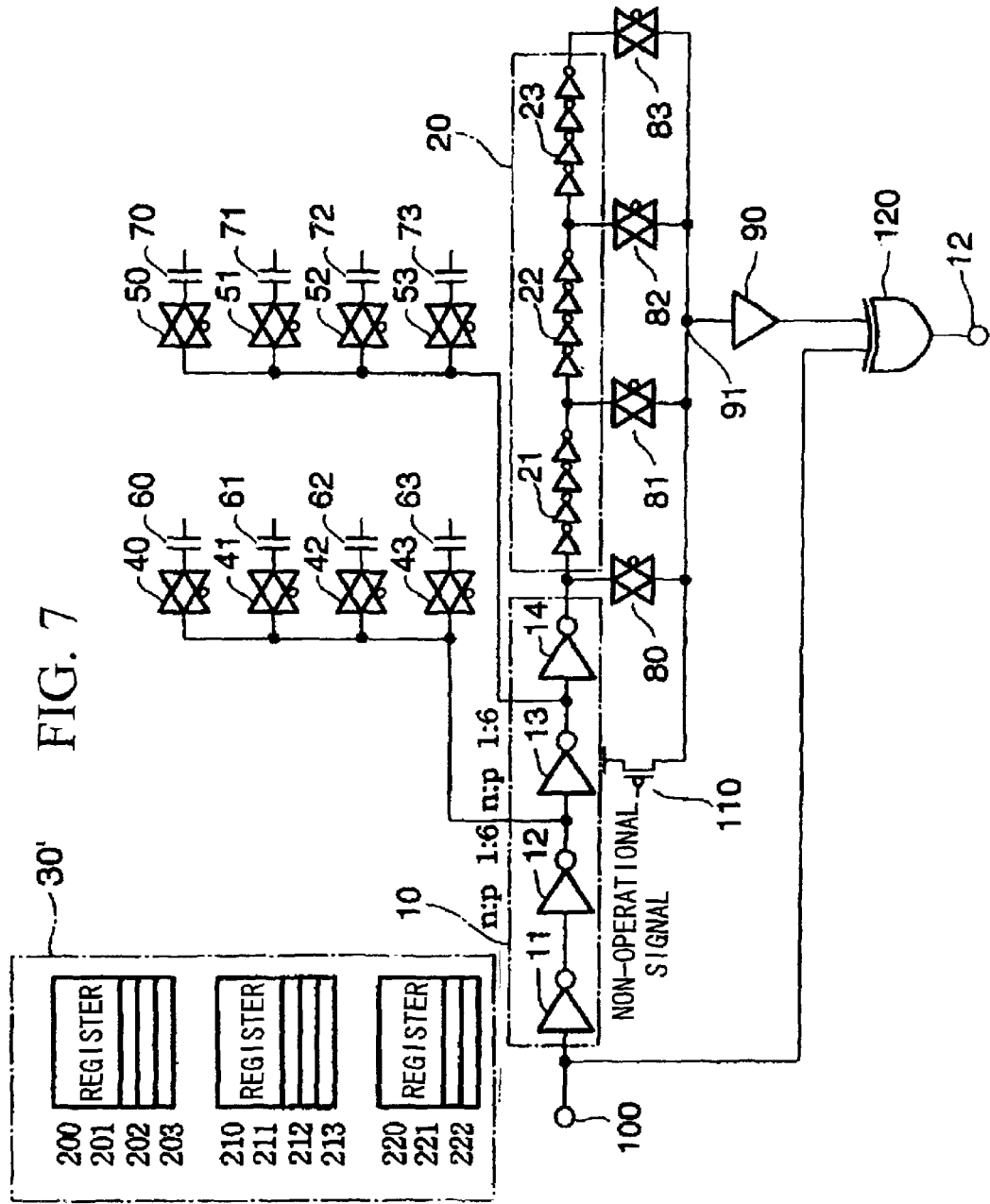
FIG. 7 is a circuit diagram showing the structure of the clock generating circuit according to the second embodiment of the present invention.

Next, the structure of the second embodiment of the present invention is shown in FIG. 7. The clock generating circuit according to this embodiment comprises the delay adjustment circuit shown in FIG. 1 that inputs the reference clock, an exclusive OR circuit 120 serving as a logic circuit that carries out logical processing of the reference clock and the output signal in the delay adjustment circuit and outputs the clock having an operational frequency N times the reference clock, and a PMOS transistor 110 serving as a setting device that fixes the output of the delay adjustment circuit to a constant value only during non-operational mode, and outputs a clock having an operational frequency equal to the reference clock when serving as a non-operational mode or N times (in the present embodiment, two times) the reference clock when serving as the operational mode based on the result of the logical processing of the exclusive OR circuit 120.

The delay adjustment circuit is essentially identical to the structure shown in FIG. 1 as described above. As shown in FIG. 7, a pre-charge PMOS transistor 110 having its source connected to the power source is added to node 91 of the delay adjustment circuit shown in FIG. 1, and in addition, the register 222 in the register array 30' is added. In the clock generating circuit in this embodiment, all of the control inputs of the transfer gates 80 to 83 are allowed to be in the OFF state, and in this case, the PMOS transistor 110 is controlled so as to be turned ON by the non-operational signal that is the input signal input to the gate of the pre-charge PMOS transistor 110.

The signals of the registers 220 to 222 are decoded by a decoder (not illustrated), supplied to the transfer gates 80 to 83 and the pre-charge PMOS transistor 110 as control input signals, and controlled such that only one among the transfer gates 80 to 83 and the pre-charge PMOS transistor 110 is turned ON. In the case that the pre-charge PMOS transistor 110 is ON, the output of the delay adjustment circuit, that is, the output of the buffer 90, becomes a constant value 1, and the delay adjustment circuit enters the non-operational mode. Therefore, by structuring the clock generating circuit using the exclusive OR circuit 120 that carries out the exclusive OR operation on the output of the delay adjustment circuit that is in the non-operational mode and the reference clock input from the input terminal 110, the clock input from the delay adjustment circuit can be set to the constant value 1, irrespective of the waveform of the reference clock, and thereby, depending on the setting of the register value, a clock can be generated wherein the operational frequency of the clock output by the output terminal 122 is equal to the reference clock when serving as the non-operational mode or two times the reference clock when serving as the operational mode.

Figure 8:
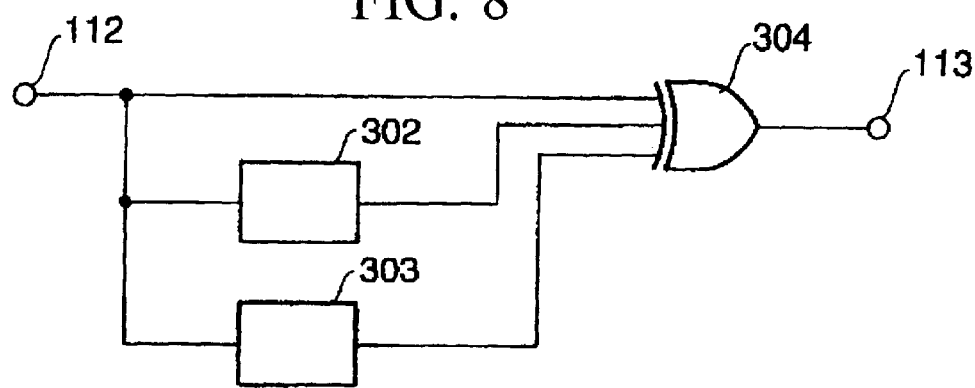
FIG. 8 is a circuit drawing showing the structure of the clock generating circuit according to the third embodiment of the present invention.

The clock generating circuit according to the third embodiment of the present invention is shown in FIG. 8 and the output timing of the relevant clock and each part of the output clock is shown in FIG. 9. In the clock generating circuit in FIG. 4, a clock that is delayed ¼ of a cycle by the delay adjustment circuit 300 is generated, but in the clock generating circuit shown in FIG. 8, a clock CLKx that is delayed ⅙ of a cycle by the delay adjustment circuit 302 and a clock CLKy that is delayed ⅓ of a cycle by the delay adjustment circuit 303 are generated.

When the exclusive OR of the reference clock CLK0, the clock CLKx delayed by ⅙ a of cycle, and the clock CLKy delayed by ⅓ of a cycle is taken by the exclusive OR circuit 304, a clock CLKz that has a controllable waveform and has an operating frequency three times the reference clock CLK0 can be generated. Similarly, according to the present embodiment, by using the reference clock as the input and carrying out logic processing of the output of a plurality of delay adjustment circuits that have differing delay time intervals, a clock can be generated that has a controllable waveform and an operational frequency that is N times the reference clock CLK0.

Figure 10:
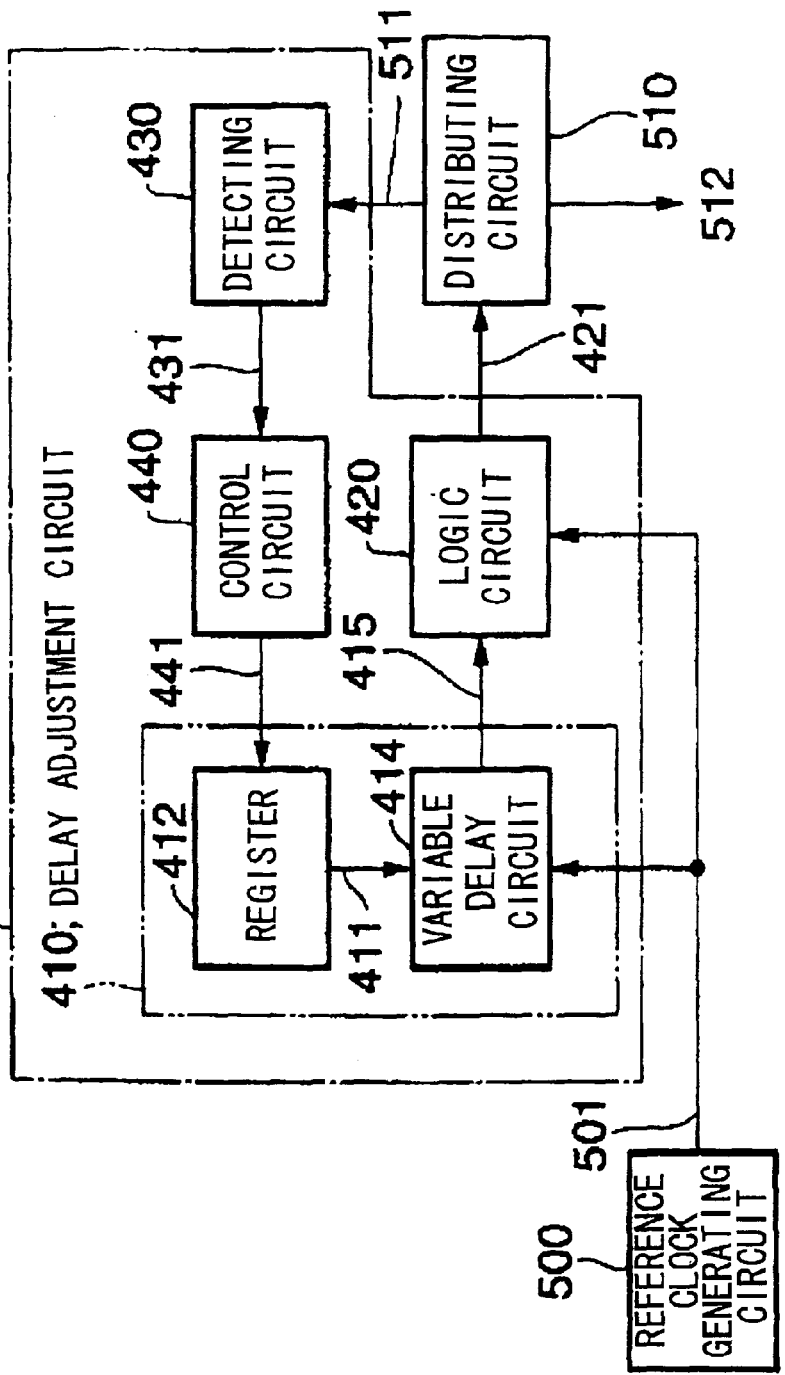
FIG. 10 is a block diagram showing the structure of the clock generating circuit according to the fourth embodiment of the present invention.

Next, the structure of the clock generating circuit according to the fourth embodiment of the present invention is shown in FIG. 10. The clock generating circuit 400 according to the resent embodiment comprises the delay adjustment circuit 410 disclosed in FIG. 1 and FIG. 7, a logic circuit that carries out logic processing of the output clock of the delay adjustment circuit 410, a detecting circuit 430 that detects the duty ratio and the clock skew of the clock output of the clock generating circuit 400, and a control circuit 440 that automatically updates the register values of register 410 in the delay adjustment circuit 410 so as to become a pre-set duty ratio and clock skew based on the detected output of the detecting circuit 430. The delay adjustment circuit 410 comprises a register 412 and a variable delay circuit. The delay adjustment circuit 410 has a structure similar to the delay adjustment circuits shown in FIG. 1 and FIG. 7, and the register 412 corresponds to register arrays 30 and 30' shown respectively in FIG. 1 and FIG. 7, and the variable delay circuit corresponds to the structure of the delay adjustment circuit shown in FIG. 1 and FIG. 7, but excluding the register arrays 30 and 30'. Reference numeral 500 is the reference clock generating circuit and reference numeral 510 is the distribution circuit.

In the above-described structure, the reference clock output from the reference clock generating circuit 500 is input into the delay adjustment circuit 410, the logic processing of the output 415 of the delay adjustment circuit and the reference clock 501 is carried out by the logic circuit 420, and by this logic processing, a clock 421 having an operational frequency N times that of the reference clock 501 is generated. The output clock 512 is output by the distribution circuit 510 from the clock 421, and distributed to each clock in the L.

From one part 511 of the output clock of the distribution circuit 510, the duty ratio and clock skew of the output clock 511 is detected by the detecting circuit 430, and the disparity between their detected values and the expected values of the clock waveform is detected. In the case that the duty value and the clock skew of the output clock 511 differ from the expected values, the control circuit 440 sets the register to an appropriate value based on the output 431 of the detecting circuit 430 in order to adjust the waveform of the output clock 421 by the delay adjustment circuit 410. The delay time interval of the clock in the variable delay circuit 420 is adjusted by the register value 411 set by the output 441 of the control circuit 440, and the output clock 421 is compensated so that the duty ratio and the clock skew agree with the expected values.

According to the clock generating circuit of the present embodiment, a delay adjustment circuit is provided is provided that adjusts the delay time interval of the input signal based on the set value of a register without using a PLL circuit, a detecting circuit that detects the duty ratio and clock skew of the clock output of this clock generating circuit, and a control circuit that automatically updates the register value in this delay adjustment circuit so as to become the duty ratio and clock skew set in advance based on the detected output of the detecting circuit, and thereby the clock generating circuit can be automatically adjusted such that the duty ratio and the clock skew of the clock become the expected values.

As another embodiment of the present embodiment, the basic structure is as described above, but in the above-described embodiment, the delay adjustment circuit used in the clock generating circuit is not limited to one, and can be two or more. As the load element of the delay adjustment circuit in each of the above-described embodiments, the capacitance value set at two-times, four-times, and eight-times is not limited thereto. There are several methods for actually providing the load elements, such as using the gate input of inverters, etc. In addition, the ratio of the gate widths in the NMOS transistor and the PMOS transistor in the inverters for adjusting the amount of the output capacitance can be designed so as to minimize the ON resistance of the NMOS transistor.

In addition, the number of transfer gates and resistors for fine and rough adjustment of the delay adjustment circuit in the above-described embodiments are simply one example and not limited thereby. In addition, switching device other than transfer gates can be used.

Furthermore, as delay elements in the delay adjustment circuit in the above described embodiments, inverters were used, but gates other than inverters can be used, and the number of gate states is not limited. In addition, as a logic circuit that carries out logic operation on the output of the delay adjustment circuits an example using an exclusive OR circuit was explained, but this is not limited thereby, and in place of an exclusive OR circuit, inverting the clock waveform by using an exclusive NAND circuit is possible. In this case, the adjustable clock edge is also inverted.

In the delay adjustment circuit in the non-operational mode in the above-described embodiment, the constant value output is realized by a pre-charge PMOS transistor, but a constant value can be output using an NMOS transistor. In addition, the constant value is not limited to 1.

Figure 11:
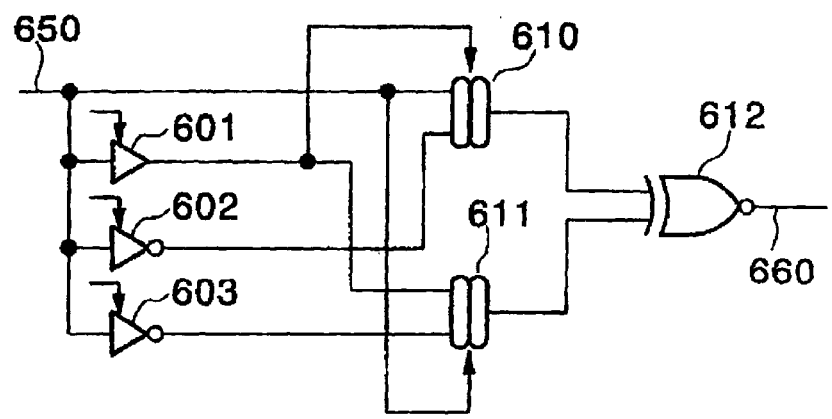
FIG. 11 is a circuit diagram showing the structure of the clock generating circuit according to the fifth embodiment of the present invention.

Next, the structure of a clock generating circuit according to the fifth embodiment of the present invention is shown in FIG. 11. In this figure, the clock generating circuit according to this embodiment comprises first, second, and third delay adjustment circuits 601, 602, 603 having a delay time interval that can be adjusted by the value of the internal register, the value of the internal memory, and an internal logic signal on board a semiconductor integrated circuit device, or an external signal, a first selector 610 that is connected in common to the input terminals of the three delay adjustment circuits 601 to 603 and selects the input of the three delay adjustment circuits 601 to 603 or the output of the second delay adjustment circuit 602 depending on one or both of the outputs of the first and third delay adjustment circuits 601 and 603, a second selector 611 that selects the output of the first or third delay adjustment circuit 601 and 603 depending on one or both of the inputs of the three delay adjustment circuits 601 to 603 or the output of the second delay adjustment circuit 602, and a logic circuit 612 that finds the exclusive AND of the output signal of the first and second selectors 610 and 611.

In FIG. 11, the input side of the first, second, and third delay adjustment circuits 601, 602, and 603 are connected in common such that the input signal 650 (in this embodiment, the reference clock) is input. By either the registers and an internal signal in the LSI, or an external signal, the output signal of the first, second, and third delay adjustment circuits 601, 602, and 603 adjusts the first delay adjustment circuit 601 so as to have a delay time interval of ¼ of the cycle time c serving as a target, adjusts the second delay adjustment circuit 602 so as to have a delay time interval of ⅔ the cycle time interval c and then be inverted, and adjusts the third delay adjustment circuit 603 so as to have a delay time interval of ¾ the cycle time c and then be inverted.

The first selector 610 selects the input signal 650 and the output of the second delay adjustment circuit 602 depending on the output of the first delay adjustment circuit 601. The second selector 611 selects the output of the first delay adjustment circuit 601 and the third delay adjustment circuit 603 depending on the input signal 650. The exclusive NOR (EX-NOR) circuit 612 finds the exclusive AND of the output of the first and second selectors 610 and 611, and outputs the output signal 660.

Here, the first selector 610 is controlled by the output of the first delay adjustment circuit 601, but a similar effect is obtained when it is controlled by both the output of the third delay adjustment circuit 603 or the output of the first and third delay adjustment circuits 601 and 603. In the same manner, the same effect is obtained when the second selector 611 is controlled by one or both of the input signal 650 or the second delay adjustment circuit 602. FIG. 12 shows the operational waveform of each of the parts shown in FIG. 11.

The input signal 650 having the operational frequency f (cycle time interval c=1/f) is input into the first, second, and third delay adjustment circuit 601, 602, and 603 (FIG. 12(A)). This input signal 650 is supplied by a delay adjustment circuit (not illustrated), and the fall of the signal has an adjustable waveform. As a result of the input signal 650 being input into the first, second, and third delay adjustment circuits 601, 602, and 603, the first, second, and third internal signals having the frequency f are output by the first, second, and third delay adjustment circuits 601, 602, and 603 (FIGS. 12(B), 12(D), and 12(F)). FIG. 12(E) shows a signal delayed by only ¾ of a cycle of the input signal 650.

The input signal 650 and the output signals (internal signals) of the first, second, and third delay adjustment circuits 601, 602, and 603 are combined by the first and second selectors 610 and 611. Specifically, the input signal 650 and the output signal of the second delay adjustment circuit 602 are combined by the first selector 610, and the output signal of the first delay adjustment circuit 601 and the output signal of the third delay adjustment signal 603 are combined by the second selector 611.

Here, the first selector 610 operates so as to select the input signal 650 when the output signal of the first delay adjustment circuit 601 is at a low level and to select the output signal of the delay adjustment circuit 602 when at a high level.

In addition, the second selector 611 selects the output signal of the delay adjustment circuit 603 when the input signal 650 is at a low level, and selects the output signal of the delay adjustment circuit 601 when at a high level. As a result, a signal that combines the input signal 650 and the output signal of the second delay adjustment circuit 602 is output by the first selector 610 (FIG. 12(G)). Additionally, the signal that combines the output signal of the first delay adjustment circuit 601 and the output signal of the third delay adjustment circuit 603 is output by the second selector 611 (FIG. 12(H)).

Logic operation is carried out on the output signal of the first selector 610 and the output signal of the second selector 611 by the exclusive AND circuit 612, and a signal (clock) having a frequency that is twice the operational frequency f of the input signal 650 is obtained (FIG. 12(I)).

According to the clock generating circuit according to the fifth embodiment of the present invention, the reference clock serves as input, the output of the first, second, and third delay adjustment circuits having a delay time interval that can be adjusted by the value of the internal register, the value of the internal memory, and the internal logic signal on board the semiconductor integrated circuit device, or an external signal is combined by the first and second selectors, and the output of these selectors is exclusive ANDed by the logic circuit, and thereby a clock having a free duty ratio irrespective of the duty ratio of the reference clock that is the input signal can be generated.

Figure 13:
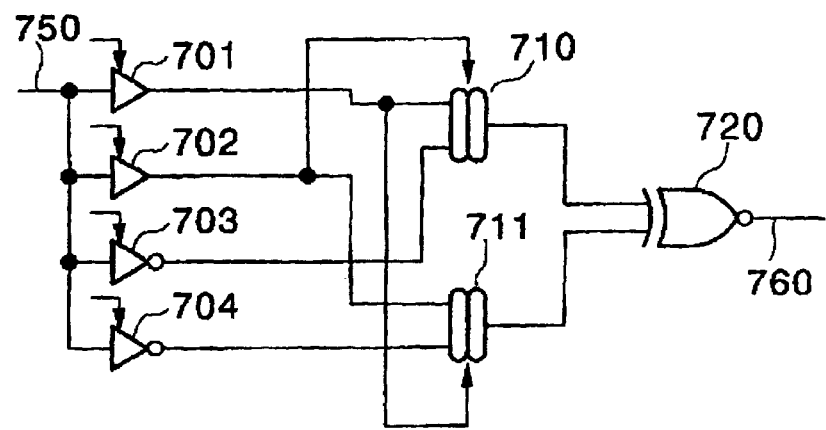
FIG. 13 is a circuit diagram showing the structure of the clock generating circuit according to the sixth embodiment of the present invention.
Figure 14:
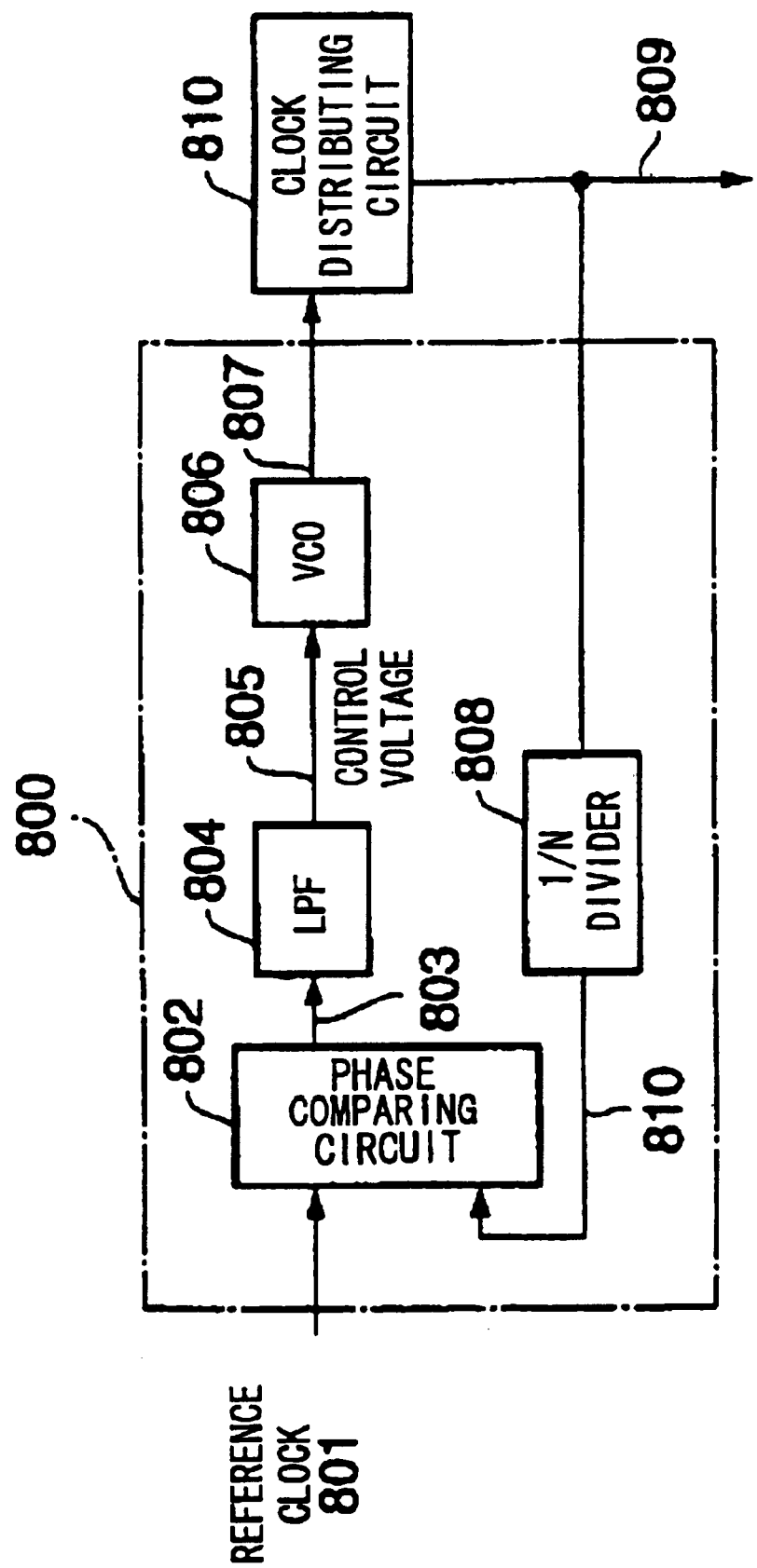
FIG. 14 is a block diagram showing the structure of a PPL circuit used in a conventional clock generating circuit.

Next, the structure of the clock generating circuit according to the sixth embodiment of the present invention is shown in FIG. 13. In this figure, the clock generating circuit according to this embodiment comprises a first, second, third, and fourth delay circuits 700, 701, 702, and 703 having a delay time internal that can be adjusted by the value of the internal register, the value of the internal memory, and the internal logic signal on board the semiconductor integrated circuit device, or an external signal, a first selector 710 that is connected in common to the input terminals of the delay adjustment circuits 700, 701, 702, and 703 and selects the output of the first or third delay adjustment circuits 700 and 702 depending on one or both of the outputs of the second and fourth delay adjustment circuits 701 and 703, a second selector 711 that selects the output of the second or fourth delay adjustment circuits 701 and 703 depending on one or both of the outputs of the first and third delay adjustment circuits 700 and 702, and a logic circuit 720 finds the exclusive AND of the output of the first and second selectors 710 and 711.

In FIG. 13, the input sides of the first, second, third, and fourth delay adjustment circuits 700, 701, 702, and 703 are connected in common, and the input signal 750 (in this embodiment, the reference clock) is input. When the cycle time that serves as respective targets is denoted c and the delay time of the selector and the exclusive AND circuit are denoted τ, the output signal of the first, second, third, and fourth delay adjustment circuits 700, 701, 702, and 703 respectively adjusts the first delay adjustment circuit 700 so as to have a delay time interval of (1/4 c–τ), and adjusts the second delay adjustment circuit 701 so as to have a delay time interval of (2/4 c–τ) by either of the register and internal signal on board the LSI, or an external signal. In addition, the third delay adjustment circuit 702 is adjusted so as to have a delay time interval of (3/4 c–τ) and is then inverted, and the fourth delay adjustment circuit 703 is adjusted so as to have a delay time interval of (c–τ) and is then inverted.

The first selector 710 selects the output of the first delay adjustment circuit 700 or the third delay adjustment circuit 702 depending on the output signal of the second delay adjustment circuit 701. The second selector 711 selects the output of the second delay adjustment circuit 701 or the output signal of the fourth delay adjustment circuit 703 according to the output signal of the first delay adjustment circuit 700. The exclusive NOR (EX-NOR) circuit 720 finds the exclusive AND of the output of the first and second selectors 710 and 711, and outputs the output signal 760.

Here, in this embodiment, the first selector 710 is controlled by the output of the second adjustment circuit 701, but the same effect can be attained when it is controlled by one or both of the outputs of the second and fourth delay adjustment circuits 701 and 703. Similarly, the same effect can be attained when the second selector 711 is controlled by one or both of the outputs of the first and third delay adjustment circuits 700 and 702.

Above, according to the clock generating circuit of the sixth embodiment of the present invention, the reference clock serves as the input and the output of the first, second, third, and fourth delay adjustment circuits, having delay times that can be adjusted by the value of the internal register, the value of the memory, and the internal logic signal on board the semiconductor integrated circuit device, or an external signal, are combined by the first and second selectors, and the exclusive AND of the output of these selectors is taken by the logic circuit, and thereby a clock having a free duty ratio can be generated irrespective of the duty ratio of the reference clock that is the input signal.

As another embodiment of the present invention, the basic structure described above can be used, but in the case, for example, of forming the delay adjustment circuit adjusted so as to have a delay time equal to ½ of the cycle time, two delay adjustment circuits that are adjusted so as to have a delay time of ¼ the cycle time can be used, or a delay adjustment circuit that can generate a fine delay time can be used.

In addition, the difference in delay times that each of the delay adjustment circuits is important here, and making this difference 1/n of the cycle time of the input waveform (clock waveform) in order to generate a wave having a frequency that is n or n/2 times the input waveform is important.

Furthermore, by exclusive ORing or exclusive ANDing the logic gate serving as the logic circuit provided at the output stage of the clock generating circuit, whether the delay adjustment circuit operates as an inverter or operates as a buffer is determined. Therefore, either a positive logic or negative logic can be used as the delay circuit.

Moreover, the present invention is not limited by any of the above-described embodiments, and each of the embodiments can be suitable modified without departing from the scope of the technical concept of the present invention.

According to the delay adjustment circuit described in the first, second, and third aspects, there are a first gate array for carrying out fine adjustment of the delay time interval that has each gate serially connected, capacitance connected to the output side of a specified gate in the first gate array via a first switching device, a second gate array for carrying out rough adjustment of the delay time interval of the input signal that is connected to the output side of the first gate array via a second switching device, and a control device that controls the first and second switching device so as to adjust the delay time interval of the input signal by adjusting the capacitance connected to the output side of the specified gate in the first gate array and the number of gate stages in the second gate array, and thereby the delay time interval of the input signal can be adjusted by controlling the internal register values, an internal signals of the semiconductor integrated circuit device, or an external signal.

According to the clock generating circuit described in the fourth aspect, a delay adjustment circuit that can adjust the waveform without using a PLL circuit is used, and thereby the clock skew caused by production variation in the semiconductor integrated circuit device and the duty ratio can be compensated, and the jitter can be minimized.

According to the semiconductor integrated circuit device described in the fifth aspect, a flip flop that operates at the timing of a specified adjustable edge in the clock generating circuit is provided between logic gates, and thereby the influence of clock skew and jitter can be suppressed to a minimum.

According to the clock generating circuit described in the sixth aspect, the delay adjustment circuit described in any of the first through third aspects is provided into which the reference clock is input, logic circuit that carries out logical processing of a reference clock and the output signal of the delay adjustment circuit described in any of the first through third aspects and outputs a clock having an operational frequency N times that of this reference clock, and a setting device that fixes the output of the delay adjustment circuit described in any of the first through third aspects to a constant value only during the non-operational mode, and wherein a clock is output that has an operational frequency that is equal to that of the reference clock when serving as the non-operational mode or N times the reference clock when serving as the operational mode based on the result of the logical processing of the logic circuit, and thereby a clock can be output that has a controllable waveform having an operational frequency equal to the reference clock when serving as a non-operational mode or N times the reference clock when serving as the reference clock.

According to the clock generating circuit described in the seventh aspect, the delay adjustment circuit described in either of the second or third aspects provides a duty ratio detecting device that detects the duty ratio of the clock output of this clock generating circuit, and a control device that automatically updates the register value in this delay adjustment circuit so as to become a pre-set duty ratio based on the detected output of the duty ratio detecting device, and thereby the duty ratio of the clock can be automatically adjusted so as to become the expected value.

According to the clock generating circuit described in the eighth aspect, the delay adjustment circuit described in either of the second or third aspects provides the clock skew detecting device that detects clock skew and a control device that automatically updates the register values in the delay adjustment circuit so that the clock skew becomes a pre-set expected value based on the detected output of the clock skew detecting device, and thereby the clock skew can be automatically adjusted so as to become a pre-set expected value.

According to the clock generating circuit described in the ninth aspect, a PPL circuit is not used, the clock waveform can be controlled, and thereby the jitter produced during operation of the semiconductor integrated circuit device (LSI) can be reduced, and the clock waveform can be adjusted with respect to the clock skew caused by production variations in the transistor function, wiring width, and wiring thickness in the LSI, and fluctuations in the duty cycle of the clock.

According to the clock generating circuit described in the tenth and eleventh aspects, the reference clock serves as the input, the output of a plurality of delay adjustment circuits having a delay time interval that can be adjusted by the internal register value, the value of the internal memory, and the internal logic signal of the semiconductor integrated circuit device, or an external signal are combined by a plurality of selectors, and the exclusive AND of the output of these selectors is taken by the logic circuit, and thereby a clock having a free duty ratio can be generated irrespective of the duty ratio of the reference clock that is the input signal.

What is claimed is:

1. A clock generating circuit comprising:
   (1) a delay adjustment circuit comprising:
      a) a first gate array that has each gate serially connected for carrying out fine adjustment of a delay time interval of an input signal;
      b) a capacitance connected to an output side of a specified gate in the first gate array via a first switching device;
      c) a second gate array that is connected to an output side of said first gate array via a second switching device and carries out rough adjustment of the delay time interval of said input signal; and
      d) a control device that controls said first switching device and said second switching device so as to adjust the delay time interval of said input signal by adjusting the capacitance connected to the output side of the specified gate in the first gate array and the number of gate stages in the second gate array;
   (2) a duty ratio detecting device that detects a duty ratio of a clock output of the clock generating circuit; and
   (3) a control device that automatically updates on output value set in a register in said delay adjustment circuit so as to become a pre-set duty ratio based on a detected output of said duty ratio detecting device.

2. The delay adjustment circuit according to claim 1, wherein said control device is provided on board the semiconductor integrated circuit device, is formed to include a register that can set an output value that depends on an internal signal, and adjust a gate output load and the number of gate stages in said second gate array by switch controlling said first and second switching device based on the output value set in said register.

3. The delay adjustment circuit according to claim 1, wherein said control device is provided on board the semiconductor integrated circuit device is formed to include a register that can set an output value externally by initialization, and adjust a gate output load and the number of gate stages in said second gate array by switch controlling said first and second switching device based on the output value set in said register.

4. A clock generating circuit comprising:
   (1) a delay adjustment circuit which comprises:
      a) a first gate array that has each gate serially connected for carrying out fine adjustment of a delay time interval of an input signal;
      b) a capacitance connected to an output side of a specified gate in the first gate array via a first switching device;
      c) a second gate array that is connected to an output side of said first gate array via a second switching device and carries out rough adjustment of the delay time interval of said input signal; and
      d) a control device that control said first switching device and said second switching device so as to adjust the delay time interval of said input signal by adjusting the capacitance connected to the output side of the specified gate in the first gate array and the number of gate stages in the second gate array;
      e) wherein said control device is provided on board the semiconductor integrated circuit device, is formed to include a register that can set an output value that depends on an internal signal, and adjust a gate output load and the number of gate stages in said second gate array by switch controlling said first and second switching device based on the output value set in said register;
   (2) a clock skew detecting device that detects clock skew; and
   (3) a control device that automatically updates an output value set in a register in said delay adjustment circuit so that the clock skew becomes a pre-set expected value based on a detected output of said clock skew detecting device.

5. The delay adjustment circuit according to claim 4, wherein said control device is provided on board the semiconductor integrated circuit device, is formed to include a register that can set an output value that depends on an internal signal, and adjust a gate output load and the number of gate stages in said second gate array by switch controlling said first and second switching device based on the output value set in said register.

6. The delay adjustment circuit according to claim 4, wherein said control device is provided on board the semiconductor integrated circuit device, is formed to include a register that can set an output value externally by initialization, and adjust a gate output load and the number of gate stages in said second gate array by switch controlling said first and second switching device based on the output value set in said register.

* * * * *